(12) United States Patent
Kinoshita et al.

(10) Patent No.: US 7,294,828 B2
(45) Date of Patent: Nov. 13, 2007

(54) DISTORTION AND SHOCK RESISTANT OPTICAL DEVICE MODULE FOR IMAGE CAPTURE

(75) Inventors: Kazuo Kinoshita, Nara (JP); Nobuhito Hirosumi, Fukuyama (JP); Takashi Yasudome, Fukuyama (JP); Hiroaki Tsukamoto, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/396,427

(22) Filed: Mar. 30, 2006

(65) Prior Publication Data

US 2006/0219885 A1   Oct. 5, 2006

(30) Foreign Application Priority Data

Mar. 31, 2005 (JP) ............................. 2005-103775

(51) Int. Cl.
*H01J 5/02* (2006.01)
*H01L 31/0203* (2006.01)

(52) U.S. Cl. ........................ 250/239; 257/434
(58) Field of Classification Search ............... 250/239; 348/335, 340, 374; 257/432–434, 678, 680; 438/64–66, 116
See application file for complete search history.

(56) References Cited

U.S. PATENT DOCUMENTS

2003/0048378 A1   3/2003 Kim et al.

2004/0164981 A1   8/2004 Fujita et al.
2004/0189854 A1   9/2004 Tsukamoto et al.
2005/0073036 A1 * 4/2005 Appelt et al. ............... 257/678
2005/0212947 A1 * 9/2005 Sato et al. ................... 348/340

FOREIGN PATENT DOCUMENTS

| JP | 2003-110946 | 4/2003 |
| JP | 2004-296453 | 10/2004 |
| JP | 2004-297282 | 10/2004 |
| JP | 2004-301938 | 10/2004 |

* cited by examiner

*Primary Examiner*—Thanh X. Luu
(74) *Attorney, Agent, or Firm*—David G. Conlin; David A. Tucker; Edwards Angell Palmer & Dodge LLP (57) ABSTRACT

A screw portion is provided on an image sensing unit, a screw hole portion to be engaged with the screw portion is provided on an optical path delimiter, and the screw portion and the screw hole portion are engaged together to thereby fix the image sensing unit and the optical path delimiter so that a lens barrel of the optical path delimiter is in contact with a transparent lid bonded to a surface of a solid-state image sensor. The solid-state image sensor, the transparent lid, a DSP, a wiring board and the like are sealed by a sealing portion made of a resin. Even when distortion occurs due to warpage, flexure or the like on the board where the solid-state image sensor is disposed, the accuracy of the positioning of the lens with respect to a pixel area of the solid-state image sensor is never decreased, it can be prevented that the solid-state image sensor or a signal processor is damaged by an external shock, and the optical device module is easily fabricated.

9 Claims, 7 Drawing Sheets

DISTORTION AND SHOCK RESISTANT OPTICAL DEVICE MODULE FOR IMAGE CAPTURE

CROSS-REFERENCE TO RELATED APPLICATIONS

This Nonprovisional application claims priority under 35 U.S.C. §119(a) on Patent Application No. 2005-103775 filed in Japan on Mar. 31, 2005, the entire contents of which are hereby incorporated by reference.

BACKGROUND OF THE INVENTION

The present invention relates to an optical device module incorporated in digital cameras, camera phones and the like and having a solid-state image sensor for photographing a subject, and a method of fabricating the optical device module.

A solid-state image sensor provided in digital cameras, camera phones and the like is for capturing the subject to be photographed. The solid-state image sensor is integrated into a module together with a lens, an infrared intercepting material and a signal processor processing the image information captured by the image sensor, and is provided as an optical device module. In recent years, digital cameras, camera phones and the like incorporating the optical device module have been reduced in size, and the optical device module has also been reduced in size.

In the optical device module, it is necessary that the optical center of the pixel area of the solid-state image sensor coincide with the optical center of the lens, and it is also necessary that the plane formed by the pixel area be orthogonal to the optical axis of the lens. When the accuracy of the positioning of the lens with respect to the solid-state image sensor is low, a problem occurs such that focus cannot be achieved or that the image captured by the solid-state image sensor is dark. For this reason, an adjustment mechanism for adjusting focus is provided, and focus adjustment is performed after the optical device module is fabricated. However, the provision of the adjustment mechanism hinders the size reduction of the optical device module.

Japanese Patent Application Laid-Open No. 2003-110946 proposes an image sensor module package in which a solid-state image sensor is bonded onto a circuit board, a housing holding an IR filter is bonded onto the circuit board so as to cover the solid-state image sensor, and a holder holding a lens is fixed to the housing. The fabrication process is simplified by fixing the holder and the housing by press fitting.

Japanese Patent Application Laid-Open No. 2004-297282 proposes a camera module in which a holder holding a lens and an optical filter is fixed by a bonding agent onto a package where an image sensor is fixed. The holder is bonded by use of two kinds of bonding agents, a volatile curing bonding agent that cures by the volatilization of the solvent and an ultraviolet curing bonding agent that cures by the application of ultraviolet light, the lens position is adjusted after temporary bonding, and after the position is determined, the bonding agent is cured to thereby fix the holder. Since the position adjustment can be performed after bonding, the lens positioning accuracy can be improved.

Japanese Patent Application Laid-Open No. 2004-301938 proposes an optical device module in which a signal processor that processes signals outputted from a solid-state image sensor is bonded to a wiring board, the solid-state image sensor is bonded onto the signal processor, a transparent lid is bonded to a surface of the solid-state image sensor and a lens holder holding a lens is bonded to the transparent lid. Since the lens holder is bonded to the transparent lid bonded to the surface of the solid-state image sensor, the accuracy of the positioning of the lens with respect to the solid-state image sensor can be improved.

BRIEF SUMMARY OF THE INVENTION

However, according to the image sensor module package described in Japanese Patent Application Laid-Open No. 2003-110946, since the holder holding the lens is fixed to the housing bonded onto the circuit board, the accuracy of the positioning of the lens with respect to the solid-state image sensor is low because of the manufacturing nonuniformity of the circuit board and the manufacturing nonuniformity of the housing.

According to the camera module described in Japanese Patent Application Laid-Open No. 2004-297282, since the holder holding the lens is bonded to the package, when distortion occurs due to warpage, flexure or the like on the plane of the package serving as the reference plane for bonding because of the manufacturing nonuniformity of the package, the accuracy of the positioning of the lens with respect to the solid-state image sensor is decreased.

According to the optical device module described in Japanese Patent Application Laid-Open No. 2004-301938, since the lens holder is bonded to the transparent lid bonded onto the solid-state image sensor and the solid-state image sensor and the transparent lid are bonded together by a sheet-form bonding agent, the transparent lid can be bonded to the solid-state image sensor with high accuracy, and the accuracy of the positioning of the lens with respect to the solid-state image sensor is high. However, since the signal processor, the solid-state image sensor and the transparent lid are placed one on another on the board and the lens holder is further bonded to the transparent lid, there is a possibility that the solid-state image sensor, the signal processor and the like are damaged due to a shock given to the lens holder.

Moreover, according to the conventional structures, the lens holder holding the lens is bonded to the transparent lid, the board or the like by a bonding agent. When the bonding agent is applied, it is difficult to make the thickness of the bonding agent uniform, and there is a possibility that excess bonding agent extends to obstruct the optical path because of an error of the thickness of the bonding agent.

The present invention is made in view of such circumstances, and an object thereof is to provide an optical device module in which a screw portion is provided on an image sensing unit, a screw hole portion to be engaged with the screw portion is provided on an optical path delimiter, the accuracy of the positioning of the lens with respect to a solid-state image sensor can be increased by fixing the image sensing unit and the optical path delimiter so that a holder of the optical path delimiter is in contact with a transparent lid bonded to a surface of the solid-state image sensor by engaging the screw portion and the screw hole portion together, and the solid-state image sensor and the transparent lid can be protected from external shocks by sealing the solid-state image sensor and the transparent lid in a resin.

Another object of the present invention is to provide an optical device module in which a signal processor can be further protected from external shocks by fixing a wiring board and the signal processor by sealing them in the resin together with the solid-state image sensor and the transparent lid and the tolerance for shocks is higher.

Another object of the present invention is to provide an optical device module in which the screw portion for fixing the image sensing unit and the optical path delimiter can be easily formed by integrally forming the screw portion of the resin.

Another object of the present invention is to provide an optical device module in which the positioning of the holder of the optical path delimiter and the transparent lid in the fabrication process can be easily performed by providing the holder with a positioning portion that uniquely determines the positions of the holder and the transparent lid.

Another object of the present invention is to provide an optical device module in which the positioning of the holder and the transparent lid in the fabrication process can be easily performed because the relative positions of the holder and the plate-form transparent lid exposed out of the resin are uniquely determined by providing the positioning portion with a claw that engages with at least two parts of one side surface of the transparent lid when the holder of the optical path delimiter is made in contact with another surface of the transparent lid.

Another object of the present invention is to provide an optical device module in which since the optical path delimiter is provided with an elastic material fixed to the holder and a supporter that supports the elastic material and the elastic material presses the holder against the transparent lid when the optical path delimiter is fixed to the image sensing unit, the holder can be firmly fixed to the transparent lid, and since the elastic material absorbs the external shocks, the tolerance for shocks is higher.

Another object of the present invention is to provide an optical device module in which since the supporter supports the elastic material so that the elastic material is movable relatively to the supporter, the positioning of the holder and the transparent lid is easily performed when the optical path delimiter is fixed to the image sensing unit in the fabrication process.

Another object of the present invention is to provide an optical device module in which since the holder is out of contact with a sealing portion made of a resin and is in contact only with the transparent lid when the optical path delimiter is fixed to the image sensing unit, the holder can be reliably positioned with respect to the transparent lid.

In an optical device module according to the present invention comprising: an image sensing unit having a solid-state image sensor having a pixel area, a transparent lid disposed so as to be opposed to the pixel area, and a bonding portion that bonds the transparent lid to the solid-state image sensor; and an optical path delimiter that has an optical material and a holder holding the optical material, and delimits an optical path to the pixel area, the image sensing unit has a sealing portion that seals the solid-state image sensor and the transparent lid in a resin in such a manner that part or all of the transparent lid is exposed, fixing means is provided for fixing the optical path delimiter to the image sensing unit by bringing the holder into contact with the part of the transparent lid exposed out of the sealing portion, and the fixing means comprises: a screw portion provided on the image sensing unit; and a screw hole portion provided on the optical path delimiter and engaged with the screw portion, and the screw portion and the screw hole portion are engaged together to thereby fix the optical path delimiter to the image sensing unit.

According to the present invention, the screw portion is provided on the image sensing unit, the screw hole portion to be engaged with the screw portion is provided on the optical path delimiter, and the screw portion and the screw hole portion are engaged together to thereby fix the image sensing unit and the optical path delimiter so that the holder of the optical path delimiter is in contact with the transparent lid bonded to a surface of the solid-state image sensor. Since the transparent lid can be bonded to the solid-state image sensor with high accuracy, the accuracy of the positioning of the lens with respect to the solid-state image sensor is high. In particular, by engaging the screw portion and the screw hole portion together, the image sensing unit and the optical path delimiter can be extremely easily fixed. For example, the screw portion provided on the image sensing unit is a male screw, the screw hole portion provided on the optical path delimiter is a female screw, and by engaging the male screw and the female screw together, the image sensing unit and the optical path delimiter can be easily fixed. Moreover, the length of the optical path to the pixel area by the optical path delimiter can be easily adjusted by the degree of engagement between the male screw and the female screw. Moreover, since the solid-state image sensor and the transparent lid are sealed in the resin in such a manner that part of the transparent lid bonded to the solid-state image sensor is exposed, the solid-state image sensor and the transparent lid are protected by the resin, so that the tolerance for external shocks is high. According to the present invention, by engaging together the screw portion provided on the image sensing unit and the screw hole portion provided on the optical path delimiter, the image sensing unit and the optical path delimiter can be extremely easily fixed. Moreover, since the solid-state image sensor and the transparent lid can be protected from external shocks by sealing the solid-state image sensor and the transparent lid in the resin, the solid-state image sensor can be prevented from being damaged by shocks. Moreover, by disposing the image sensing unit and the optical path delimiter so that the holder of the optical path delimiter is in contact with the transparent lid, even when distortion occurs due to warpage, flexure or the like on the board where the solid-state image sensor is disposed, the accuracy of the positioning of the lens with respect to the solid-state image sensor is not decreased, and by fixing the optical path delimiter to the transparent lid, an error in the lens position due to an error of the thickness of the bonding agent does not occur. Consequently, a mechanism that performs focus adjustment after fabrication is unnecessary, so that the size of the optical device module can be reduced.

In an optical device module according to the present invention, the image sensing unit has: a wiring board where a conductor wiring is formed; and a signal processor fixed to the wiring board and electrically connected to the conductor wiring, and the sealing portion seals the wiring board and the signal processor in the resin together with the solid-state image sensor and the transparent lid.

According to the present invention, since the wiring board, the signal processor, the solid-state image sensor and the transparent lid are firmly fixed by fixing the wiring board and the signal processor in the resin together with the solid-state image sensor and the transparent lid, the solid-state image sensor, the signal processor and the like can be prevented from being damaged by shocks. Moreover, since the optical device module can be easily fabricated, the manufacturing cost can be reduced.

In an optical device module according to the present invention, the screw portion is made of a resin, and formed integrally with the sealing portion.

According to the present invention, by integrally forming the screw portion, for fixing the image sensing unit and the optical path delimiter, of the resin, the screw portion can be easily formed, so that the fabrication process is not complicated and the increase in the manufacturing cost due to the formation of the screw portion can be suppressed.

In an optical device module according to the present invention, the holder has a positioning portion that determines relative positions of the holder and the transparent lid.

According to the present invention, the holder has the positioning portion that determines the positions of the holder of the optical path delimiter and the transparent lid and when the optical device module is fabricated, the holder is brought into contact with the transparent lid so that the positions can be uniquely determined. Consequently, the positioning of the holder and the transparent lid in the fabrication process can be easily performed and the fabrication process can be simplified.

In an optical device module according to the present invention, the transparent lid has a plate form, and one surface thereof and part or all of a side surface thereof are exposed out of the sealing portion, and the positioning portion has a claw that engages with at least two parts of a side surface of the transparent lid when the holder is made in contact with one surface of the transparent lid.

According to the present invention, part of the plate-form transparent lid is exposed out of the resin of the sealing portion, and when the holder of the optical path delimiter is made in contact with one surface of the transparent lid, the claw of the positioning portion of the holder engages with at least two parts of the side surface of the transparent lid to thereby fix the relative positions of the holder and the transparent lid. Thereby, only by bringing the holder into contact with the transparent lid, the positions of the holder and the transparent lid are uniquely determined and the positioning of the holder and the transparent lid can be easily performed, so that the fabrication process can be simplified.

In an optical device module according to the present invention, the optical path delimiter has: an elastic material fixed to the holder; and a supporter that supports the elastic material, and when the optical path delimiter is fixed to the image sensing unit, the elastic material presses the holder against the transparent lid.

According to the present invention, the elastic material is fixed to the holder, and the optical path delimiter has the supporter that supports the elastic material. When the optical path delimiter is fixed to the image sensing unit, the elastic material presses the holder against the transparent lid to thereby firmly fix the holder to the transparent lid. Moreover, since the elastic material absorbs the external shocks, the solid-state image sensor, the transparent lid and the like can be prevented from being damaged by shocks.

In an optical device module according to the present invention, the supporter supports the elastic material so that the elastic material is movable relatively to the supporter.

According to the present invention, the supporter supports the elastic material so that the elastic material is movable relatively to the supporter. Whereby, when the optical path delimiter is fixed to the image sensing unit in the fabrication process, the positioning of the holder and the transparent lid can be easily performed, so that the fabrication process can be simplified.

In an optical device module according to the present invention, the holder is out of contact with the sealing portion when the optical path delimiter is fixed to the image sensing unit.

According to the present invention, when the optical path delimiter is fixed to the image sensing unit, the holder is out of contact with the sealing portion made of the resin and is in contact only with the transparent lid. There is no possibility that the positions of the holder and the transparent lid are shifted by the holder being in contact with the sealing portion, and the holder can be reliably positioned with respect to the transparent lid, so that the accuracy of the positioning of the lens with respect to the solid-state image sensor is not decreased.

The above and further objects and features of the invention will more fully be apparent from the following detailed description with accompanying drawings.

DETAILED DESCRIPTION OF THE INVENTION

Hereinafter, the present invention will be concretely described with reference to the drawings showing an embodiment thereof.

Figure 1:
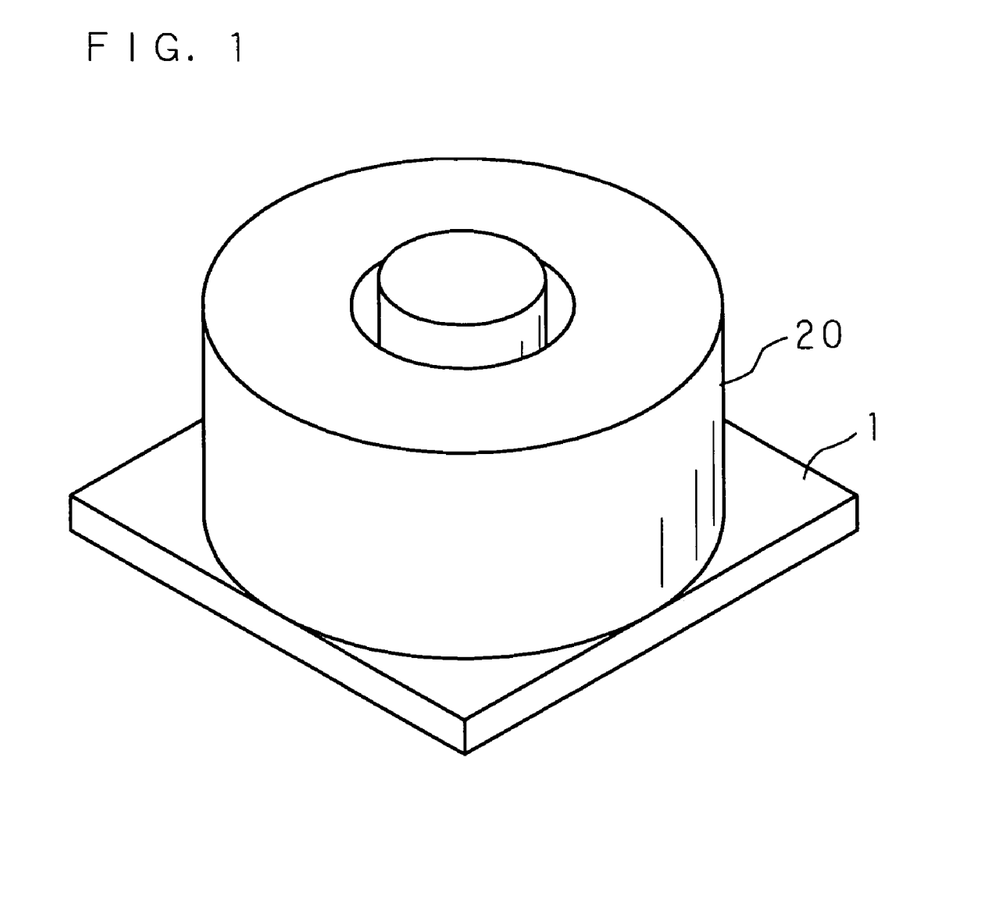
FIG. 1 is a perspective view showing the appearance of an optical device module according to the present invention.
Figure 2A:
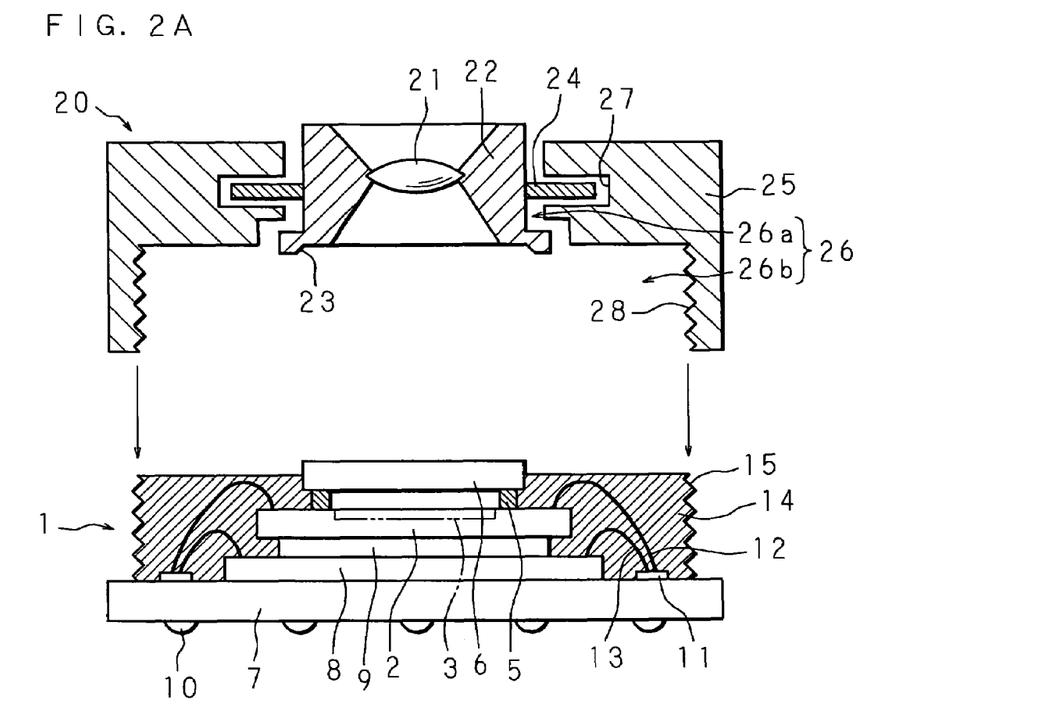
FIGS. 2A and 2B are schematic cross-sectional views showing the structure of the optical device module according to the present invention.
Figure 2B:
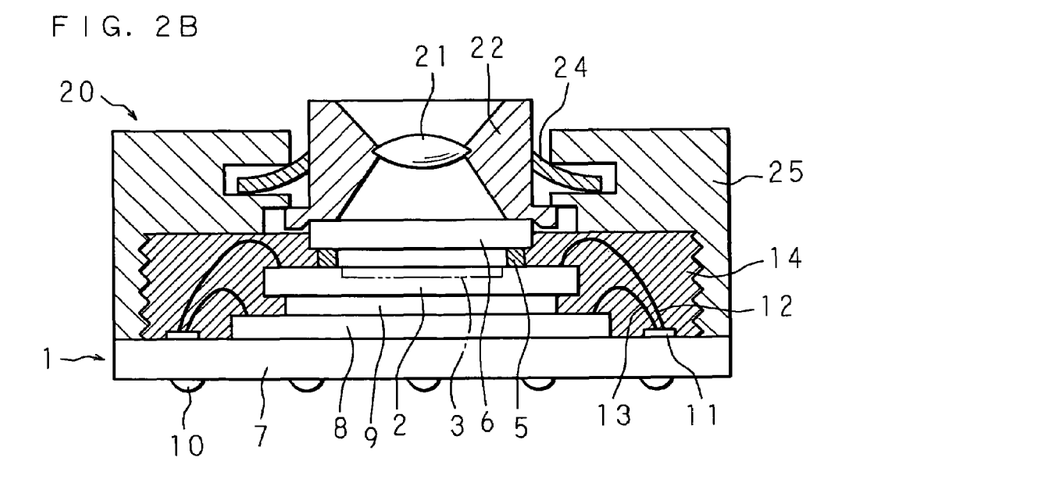
Figure 3:
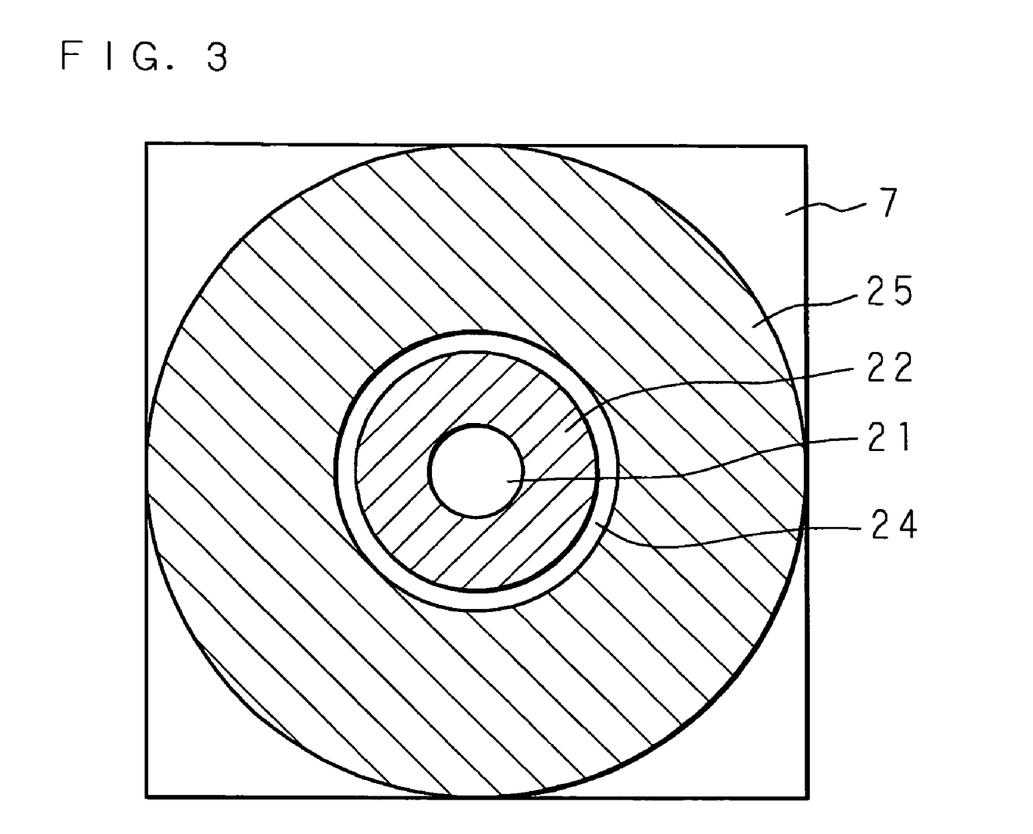
FIG. 3 is a plan view showing the appearance of the optical device module according to the present invention.
Figure 4:
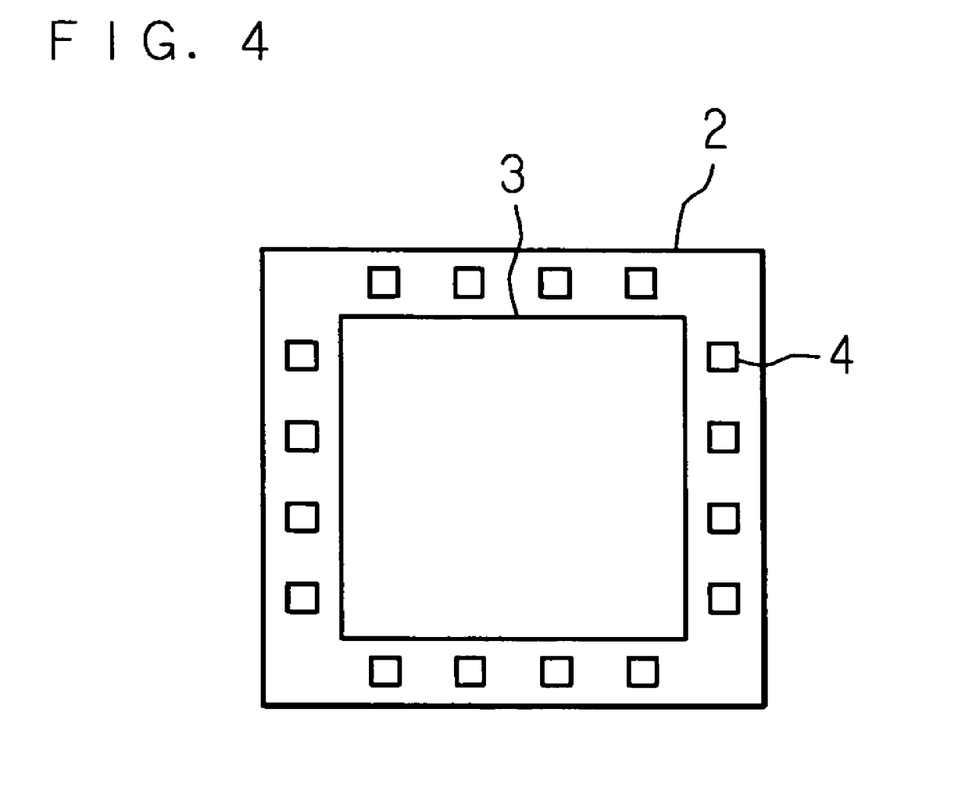
FIG. 4 is a plan view showing a solid-state image sensor of the optical device module according to the present invention.

FIG. 1 is a perspective view showing the appearance of an optical device module according to the present invention. FIGS. 2A and 2B are schematic cross-sectional views showing the structure of the optical device module according to the present invention. FIG. 3 is a plan view showing the appearance of the optical device module according to the present invention. FIG. 4 is a plan view showing a solid-state image sensor of the optical device module according to the present invention. FIG. 2A shows a condition in which an optical path delimiter is not fixed to an image sensing unit of the optical device module. FIG. 2B shows a condition in which the optical path delimiter is fixed.

In these figures, reference numeral 1 represents an image sensing unit having a solid-state image sensor 2 that receives external light, and reference numeral 20 represents an optical path delimiter having a lens 21. The image sensing unit 1 and the optical path delimiter 20 are separately fabricated, and thereafter, the optical path delimiter 20 is fixed to the image sensing unit 1 to thereby fabricate the optical device module. The image sensing unit 1 includes the solid-state image sensor 2, a transparent lid 6 protecting the solid-state image sensor 2, and a DSP 8 serving as a signal processor. These are placed one on another on a wiring board 7.

The solid-state image sensor 2 is formed by applying a semiconductor process technology to a semiconductor board such as silicon. On the solid-state image sensor 2, the following are formed: a pixel area 3 for performing photoelectric conversion; and a plurality of bonding pads 4 serving as connection terminals for connection to external circuits, input and output of electric signals and supply of power. On the surface of the solid-state image sensor 2 where the pixel area 3 is formed, the transparent lid 6 is bonded by a bonding portion 5 so as to be opposed to the pixel area 3. The bonding portion 5 has a substantially rectangular shape surrounding the perimeter of the pixel area 3, and bonds the substantially rectangular transparent lid 6 to the solid-state image sensor 2 so that the space between the pixel area 3 and the transparent lid 6 is enclosed. By enclosing the space between the pixel area 3 and the transparent lid 6, the infiltration of moisture to the pixel area 3 and the entry and adhesion of dust can be prevented, so that the occurrence of malfunctions on the pixel area 3 can be prevented.

The transparent lid 6 has a rectangular plate form, and is made of a transparent material such as glass. The solid-state image sensor 2 captures the external incident light having passed through the transparent lid 6, and receives it by a plurality of light receiving elements arranged on the pixel area 3. Since an infrared intercepting film is applied to a surface of the transparent 6, the transparent lid 6 has the function of intercepting external infrared light.

The bonding portion 5, which has a sheet-form bonding agent attached thereto, is formed by patterning by performing processing such as exposure or development by the photolithography technology. Since the photolithography technology is used, the patterning of the bonding portion 5 can be performed with high accuracy. Since a sheet-form bonding agent is used, the thickness of the bonding portion 5 can be made uniform. Whereby, the transparent lid 6 can be bonded to the pixel area 3 with high accuracy.

The solid-state image sensor 2 to which the transparent lid 6 is bonded is placed, together with the DSP 8, on the wiring board 7 where a conductor wiring 11 is formed by patterning. The structure of the lamination is such that the DSP 8 is bonded onto the wiring board 7, a spacer 9 as which a rectangular-plate-form silicon piece is used is bonded onto the DSP 8 and the solid-state image sensor 2 is bonded onto the spacer 9. The DSP 8 is a semiconductor chip that controls the operation of the solid-state image sensor 2 and processes the signals outputted from the solid-state image sensor 2. By disposing the DSP 8 in the same module as the solid-state image sensor 2, digital cameras, camera phones and the like provided with the optical device module can be reduced in size. A plurality of bonding pads (not shown) for performing input and output of electric signals and the like are formed on a surface of the DSP 8. After the DSP 8 is bonded onto the wiring board 7, the bonding pads of the DSP 8 and the conductor wiring 11 of the wiring board 7 are electrically connected together by bonding wires 13.

The bonding pads 4 of the solid-state image sensor 2 bonded onto the spacer 9 and the conductor wiring 11 on the wiring board 7 are electrically connected together by bonding wires 12. Since the DSP 8 and the solid-state image sensor 2 are electrically connected together through the conductor wiring 11 on the wiring board 7, transmission and reception of electric signals can be performed therebetween. In order that the bonding wires 12 are out of contact with the DSP 8 or the bonding wires 13, the distance between the solid-state image sensor 2 and the DSP 8 is adjusted by the spacer 9.

The DSP 8, the solid-state image sensor 2 and the like placed one on another on the wiring board 7 are fixed by being sealed in a resin. A sealing portion 14 made of a resin is formed substantially in the shape of a rectangular parallelepiped on the wiring board 7, and the upper surface and approximately half of the transparent lid 6 protrude from the upper surface of the sealing portion 14. On the side surface of the sealing portion 14, a screw portion 15 is provided so that the image sensing unit 1 functions as a male screw.

A plurality of hemispherical connection terminals 10 for performing input and output of signals between the optical device module and digital cameras, camera phones or the like provided with the optical device module are provided in a protruding condition on the lower surface of the wiring board 7. The connection terminals 10 are electrically connected to the conductor wiring 11 formed on the upper surface of the wiring board 7.

The optical path delimiter 20 for directing the external light to the pixel area 3 of the solid-state image sensor 2 includes the lens 21, a lens barrel 22 serving as the holder holding the lens 21, and a supporter 25 supporting the lens barrel 22 through an elastic material 24. While the lens barrel 22 has the shape of a cylinder in the figures, it may have the shape of a rectangular parallelepiped. The lens 21 is fixed to the inner surface of the lens barrel 22 so that the axial center of the lens barrel 22 and the optical axis of the lens 21 coincide with each other.

Four positioning claws 23 are arranged at regular intervals along the circumference on one end of the lens barrel 22. The positioning claws 23 determine the relative positions of the lens barrel 22 and the transparent lid 6 with respect to the direction of the plane of the transparent lid 6. The positioning claws 23 protrude in the axial direction from the side of the end of the lens barrel 22 to the outside of the end surface of the lens barrel 22. When the optical path delimiter 20 is fixed to the image sensing unit 1, the end surface of the lens barrel 22 abuts on the surface of the transparent lid 6, the four positioning claws 23 abut on the periphery of the transparent lid 6 and the transparent lid 6 is caught by the positioning claws 23, thereby fixing the relative positions of the transparent lid 6 and the lens barrel 22. Since the distance between respective two opposed positioning claws 23 is substantially the same as the length of the corresponding side of the transparent lid 6, the relative positions of the transparent lid 6 and the lens barrel 22 are never shifted.

The disk-shaped elastic material 24 is fixed substantially in the center of the periphery of the lens barrel 22. The optical path delimiter 20 has the supporter 25 that supports the lens barrel 22 through the elastic material 24. The supporter 25 has a substantially circular through hole 26 vertically passing through the supporter 25. The through hole 26 includes two interconnected holes 26a and 26b having different inner diameters. The diameter of the upper hole 26a of the through hole 26 is larger than that of the lens barrel 22. A groove 27 where the diameter is larger than the inner diameter of the hole 26 is formed on the inner surface of the hole 26a. The elastic material 24 fixed to the lens barrel 22 is inserted in the groove 27 to thereby support the lens barrel 22 in the hole 26a of the supporter 25 through the elastic material 24. Since the groove 27 is slightly larger than the elastic material 24, the lens barrel 22 and the elastic material 24 can be slightly moved within the hole 26a in the direction of the axial center of the through hole 26 and the direction of the plane perpendicular to the axial center.

On the inner surface of the lower hole 26b of the through hole 26, a screw hole portion 28 to be engaged with the screw portion 15 is provided so that the optical path delimiter 20 functions as a female screw. The screw portion 15 provided on the image sensing unit 1 (the sealing portion 14) and the screw hole portion 28 provided on the optical path delimiter 20 (the supporter 25) are engaged together to thereby fix the image sensing unit 1 and the optical path delimiter 20.

When the screw portion 15 of the image sensing unit 1 and the screw hole portion 28 of the optical path delimiter 20 are engaged together to thereby fix the image sensing unit 1 and the optical path delimiter 20, the image sensing unit 1 and the optical path delimiter 20 are fixed so that the upper surface of the sealing portion 14 of the image sensing unit 1 and the lower surface of the supporter 25 of the optical path delimiter 20 are in contact with each other. The lower end surface of the lens barrel 22 is in contact with the upper surface of the transparent lid 6 and the positioning claws 23 abut on the periphery of the transparent lid 6 from four directions to thereby fix the relative positions of the lens barrel 22 and the transparent lid 6. At this time, since the relative positions are fixed so that the upper end of the lens barrel 22 protrudes from the hole 26a and the part, of the periphery of the lens barrel 22, where the elastic material 24 is fixed is situated above the groove 27 of the supporter 25, the lens barrel 22 is pushed downward by the elastic material 24, so that the lens barrel 22 is firmly fixed to the transparent lid 6. Since the lens barrel 22 and the elastic material 24 are movable within the hole 26a, even when there is an error in the shapes of the sealing portion 14 and the supporter 25, the error never affects the positions of the transparent lid 6 and the lens barrel 22. The positioning claws 23 of the lens barrel 22 are out of contact with the upper surface of the sealing portion 14 when the lens barrel 22 is fixed to the transparent lid 6, the diameter of the opening at the lower end of the hole 26a is larger than the inner diameter of the hole 26a, and the lower surface of the supporter 25 is out of contact with the transparent lid 6 and the positioning claws 23.

Figure 5A:
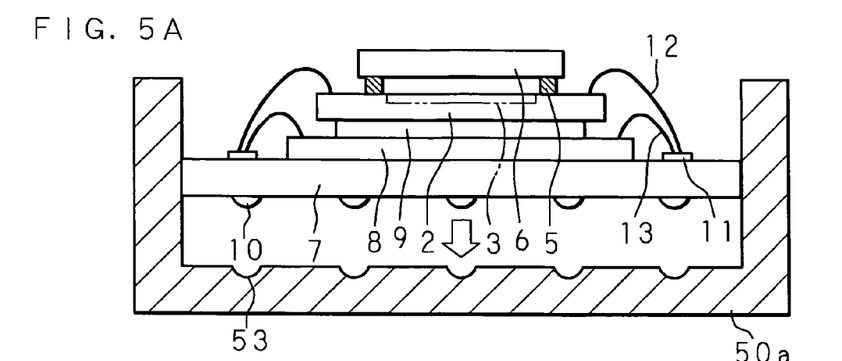
FIGS. 5A to 5F are schematic views showing the fabrication process of the optical device module according to the present invention.
Figure 5B:
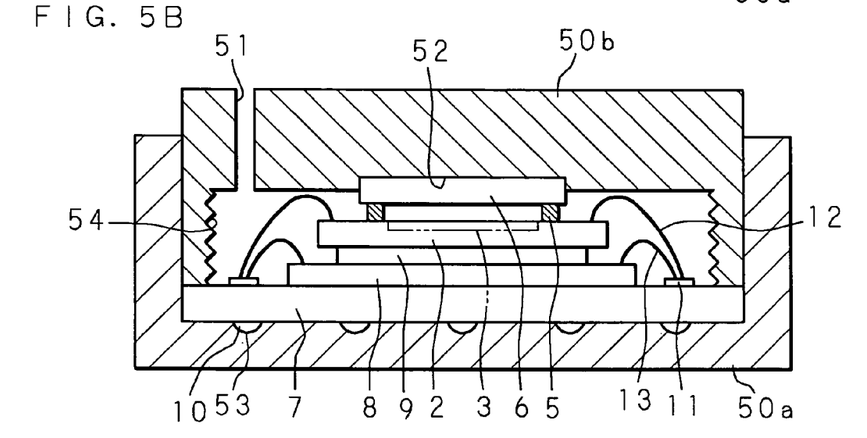
Figure 5C:
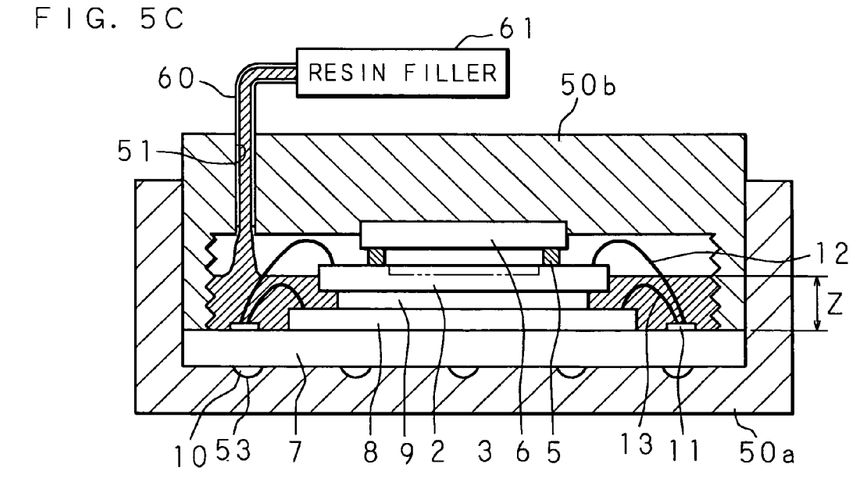
Figure 5D:
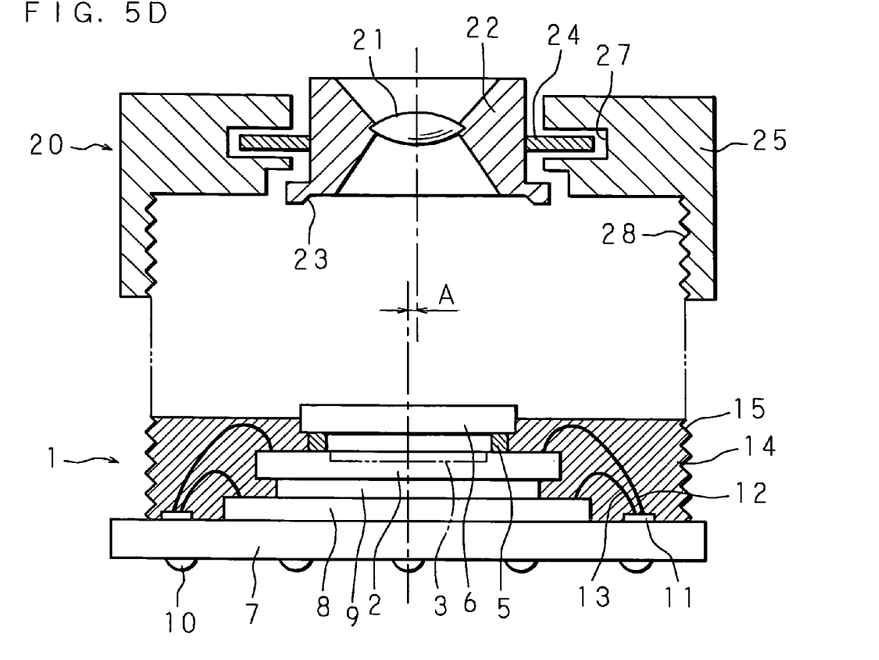
Figure 5E:
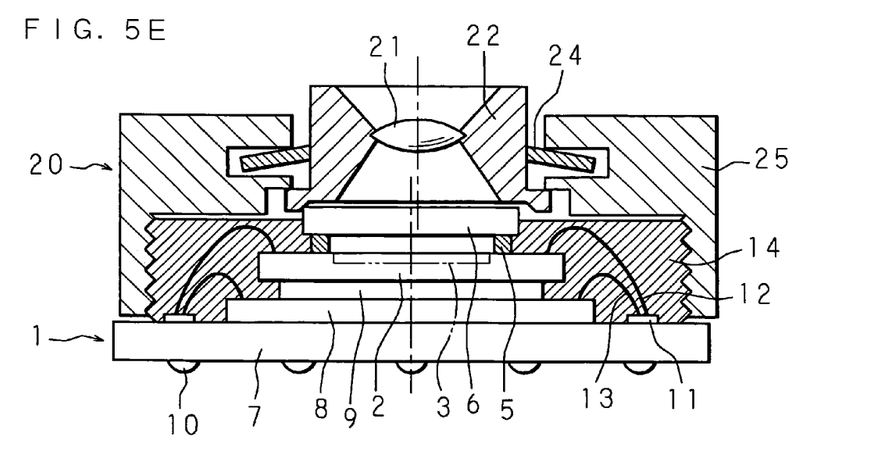
Figure 5F:
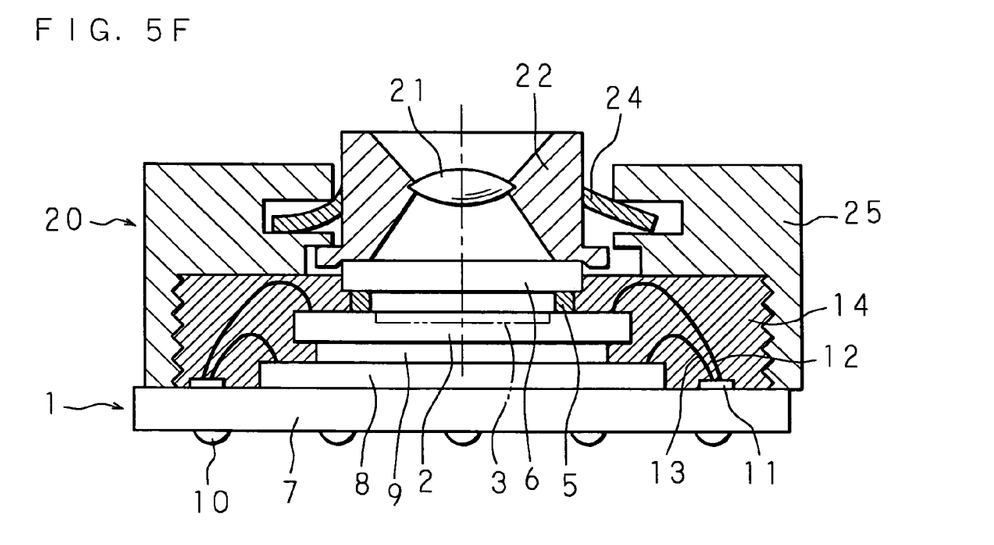

FIGS. 5A to 5F are schematic views showing the fabrication process of the optical device module according to the present invention. FIGS. 5A, 5B and 5C show a process to seal the image sensing unit 1 in the resin. FIGS. 5D, 5E and 5F show a process to fix the optical path delimiter 20 to the image sensing unit 1.

The DSP 8, the solid-state image sensor 2 and the like placed one on another on the wiring board 7 are placed into a container 50a to be filled with the resin (FIG. 5A). The size of the bottom surface inside the container 50a is substantially the same as that of the wiring board 7. A plurality of hemispherical concave portions 53 for accommodating the disposed connection terminals 10 are formed on the lower surface of the wiring board 7 so that the bottom surface inside the container 50a and the lower surface of the wiring board 7 are in close contact with each other. The resin is prevented from flowing to the lower surface of the wiring board 7 by making the bottom surface inside the container 50a and the lower surface of the wiring board 7 in close contact with each other.

Then, a lid 50b is inserted along the inner surface of the container 50a to constitute a mold, and the space within the mold is enclosed. Precisely, the lid 50b has an inlet 51 for filling the resin, and the inside of the mold communicates with the outside only through the inlet 51 (FIG. 5B). Female screw grooves 54 are formed on the leg portion of the lid 50b. A cylindrical filling pipe 60 is inserted in the inlet 51, and the resin is filled into the mold through the filling pipe 60 by a resin filler 61 (FIG. 5C). Then, the resin cures, so that the sealing portion 14 having the screw portion 15 on its side surface is formed in the image sensing unit 1. The hermeticity required of the mold is not very high, and it is necessary only that the hermeticity is high enough for the screw portion 15 to be formed when the resin cures. A concave portion 52 for accommodating an upper part of the transparent lid 6 may be formed on the upper surface inside the lid 50b as shown in the figure. In this case, the sealing portion 14 can be formed so that the upper part of the transparent lid 6 accommodated in the concave portion 52 is always exposed out of the upper surface of the sealing portion 14 even when a resin of an amount larger than the volume of the space of the mold is filled. It is to be noted that the height Z of the sealing portion 14 may be adjusted by controlling the filling amount of the resin.

Then, after the image sensing unit 1 is sealed in the resin as described above, the optical path delimiter 20 fabricated separately is fixed to the image sensing unit 1. First, the engagement of the screw portion 15 of the image sensing unit 1 and the screw hole portion 28 of the optical path delimiter 20 is started (FIG. 5D). At the start of the engagement, the transparent lid 6 of the image sensing unit 1 and the positioning claws 23 of the optical path delimiter 20 are not engaged with each other. Under this condition, the optical axis of the lens 21 and the optical center of the pixel area of the solid-state image sensor 2 may disaccord with each other (A≠0), and they rarely coincide with each other because of the manufacturing nonuniformity.

Then, as the screw portion 15 and the screw hole portion 28 are gradually engaged together, the transparent lid 6 of the image sensing unit 1 and the positioning claws 23 of the optical path delimiter 20 come into contact with each other (FIG. 5E). FIG. 5E shows a condition where the left positioning claws 23 are in contact with the transparent lid 6. Then, by further engaging the screw portion 15 and the screw hole portion 28 together, the relative position of the lens barrel 22 with respect to the transparent lid 6 automatically moves in a direction where the optical axis of the lens 21 and the optical center of the pixel area of the solid-state image sensor 2 coincide with each other, the lens barrel 22 is fixed by being pressed against the transparent lid 6 by the elastic material 24, and the supporter 5 is fixed to the image sensing unit 1 by the screw portion 15 and the screw hole portion 28 so as to be immovable (FIG. 5F). As described above, since the transparent lid 6 moves along the ridgeline of the positioning claws 23 by the pressing, the optical axis of the lens 21 and the optical center of the pixel area 3 of the solid-state image sensor 2 can be made to coincide with each other. The configuration of the ridgeline of the positioning claws 23 is appropriately determined in consideration of the manufacturing nonuniformity.

In the optical device module having the above-described structure, since the optical path delimiter 20 is disposed so that the lower end of the lens barrel 22 is in contact with the upper surface of the transparent lid 6, the distance between the pixel area 3 of the solid-state image sensor 2 and the lens 21 is uniquely determined by the sum total of the thickness of the bonding portion 5 and the transparent lid 6 and the distance from the lower end of the lens barrel 22 to the part where the lens 21 is fixed. Since the positioning claws 23 of the lens barrel 22 abut on the periphery of the transparent lid 6 from four directions to thereby fix the relative positions, the position of the lens 21 in the direction of the plane of the transparent lid 6 is uniquely determined. Since the transparent lid 6 is bonded while highly accurately positioned with respect to the pixel area 3 of the solid-state image sensor 2, the lens barrel 22 can be fixed while highly accurately positioned with respect to the pixel area 3 with reference to the transparent lid 6.

Since the solid-state image sensor 2, the DSP 8 and the like of the image sensing unit 1 are sealed in a resin, these can be protected from external shocks, and the manufacturing process is easy. Since the lens barrel 22 of the optical path delimiter 20 is supported by the supporter 25 through the elastic material 24 and the elastic material 24 is movable within the groove 27 of the supporter 25, the lens barrel 22 and the supporter 25 can be fixed to the image sensing unit 1 by different procedures, and the position of the lens 21 can be fixed with respect to the solid-state image sensor 2 without affected by a configuration error of the sealing portion 14 and the supporter 25.

While the lens barrel 22 of the optical path delimiter 20 has the positioning claws 23 in the present embodiment, it may be provided with no positioning claw 23. In this case, the positioning in the direction of the plane is performed in the process to bring the lower surface of the lens barrel 22 into contact with the upper surface of the transparent lid 6, and thereafter, the supporter 5 is fixed to the image sensing unit 1. While the solid-state image sensor 2 and the DSP 8 serving as the signal processor are placed one on another as separate semiconductor chips, they may be formed as one semiconductor chip. A semiconductor chip other than the DSP 8 may be placed together with the solid-state image sensor 2. Further, a multiplicity of semiconductor chips may be placed one on another. The shape of the mold for the sealing in a synthetic resin is merely an example, and the present invention is not limited thereto.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. An optical device module, comprising:
   an image sensing unit comprising:
      a solid-state image sensor having a pixel area;
      a transparent lid disposed so as to be opposed to the pixel area;
      a bonding portion that bonds the transparent lid to the solid-sate image sensor; and
      a sealing portion that seals the solid-state image sensor and the transparent lid in a resin in such a manner that part or all of the transparent lid is exposed;
   an optical path delimiter that has an optical material and a holder holding the optical material, and delimits an optical path to the pixel area; and
   fixing means for fixing the optical path delimiter to the image sensing unit by bringing the holder into contact with a part of the transparent lid exposed out of the sealing portion;
   wherein the fixing means comprises:
      a screw portion provided on the sealing portion; and,
      a screw hole portion provided on the optical path delimiter engaged with the screw portion such that the screw portion and the screw hole portion engaged together to thereby fix the optical path delimiter to the image sensing unit.

2. The optical device module according to claim 1, wherein
   the screw portion is formed integrally with the sealing portion.

3. The optical device module according to claim 1, wherein
   the image sensing unit has:
      a wiring board where a conductor wiring is formed; and
      a signal processor fixed to the wring board and electrically connected to the conductor wiring; and
      the sealing portion seals the wiring board and the signal processor in the resin together with the solid-state-image sensor and the transparent lid.

4. The optical device module according to claim 3, wherein
   the screw portion is made of resin, and formed integrally with the sealing portion.

5. The optical device module according to claim 1, wherein
   the holder has a positioning portion that determines relative positions of the holder and the transparent lid.

6. The optical device module according to claim 5 wherein
   the transparent lid has a plate form, and one surface thereof and part or all of a side surface thereof are exposed out of the sealing portion, and
   the positioning portion has a claw that engages with at least two parts of a side surface of the transparent lid when the holder is in contact with one surface of the transparent lid.

7. The optical device module according to claim 1 wherein
   the optical path delimiter has:
      an elastic material affixed to the holder; and
      a supporter that supports the elastic material,
   such that when the optical path delimiter is fixed to the image sensing unit, the elastic material presses the holder against the transparent lid.

8. The optical device module according to claim 7, wherein
   the supporter supports the elastic material so that the elastic material is movable relative to the supporter.

9. The optical device module according to claim 1, wherein
   the holder is out of contact with the sealing portion when the optical path delimiter is fixed to the image sensing unit.

* * * * *